(12) United States Patent
Shiota et al.

(10) Patent No.: US 7,291,185 B2
(45) Date of Patent: Nov. 6, 2007

(54) METHOD OF MANUFACTURING BOTH-SIDE METALLIZED FILM WITH REDUCED BLOCKING OF METALLIZED FILM AND METALLIZED FILM CAPACITOR USING THE SAME

(75) Inventors: Kohei Shiota, Hyogo (JP); Toshiharu Saito, Hyogo (JP); Kazumi Osamura, Osaka (JP); Hiroki Takeoka, Osaka (JP); Kazuhiro Nakatsubo, Toyama (JP); Toshiyuki Nishimori, Toyama (JP); Masatoshi Shibuya, Toyama (JP); Toshihiro Sasaki, Toyama (JP); Shigeo Okabe, Toyama (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 505 days.

(21) Appl. No.: 10/479,594

(22) PCT Filed: Jun. 6, 2002

(86) PCT No.: PCT/JP02/05590

§ 371 (c)(1), (2), (4) Date: May 24, 2004

(87) PCT Pub. No.: WO02/101768

PCT Pub. Date: Dec. 19, 2002

(65) Prior Publication Data

US 2004/0207970 A1 Oct. 21, 2004

(30) Foreign Application Priority Data

Jun. 8, 2001 (JP) ............................. 2001-173662
Mar. 29, 2002 (JP) ............................. 2002-096442

(51) Int. Cl.
*H01G 9/00* (2006.01)

(52) U.S. Cl. .................... 29/25.03; 29/25.42; 29/825; 361/303; 361/311

(58) Field of Classification Search .......... 29/825–830, 29/600, 602.1, 25.35–25.42; 361/271, 301.5, 361/312, 323, 329; 427/81, 209, 250, 256, 427/282, 363, 372.1; 156/277, 256, 182, 156/306.3

See application file for complete search history.

(56) References Cited

U.S. PATENT DOCUMENTS 3,895,129 A 7/1975 Craig et al.

(Continued)

FOREIGN PATENT DOCUMENTS

JP 4-99166 3/1992

(Continued)

*Primary Examiner*—Minh Trinh
(74) *Attorney, Agent, or Firm*—Wenderoth, Lind & Ponack, L.L.P.

(57) ABSTRACT

A method of manufacturing a both-side metallized insulation film comprises steps of: depositing zinc or a blend of zinc and aluminum onto both sides of an insulation film; and winding this metallized film into a product roll. The method is characterized in spraying an oxidizing gas onto a deposited layer on an inner side of the insulation film to be wound, during the winding step. During a vacuum deposition step, an oil layer is formed on at least one side of the metallized film. In addition, an oxide layer is formed by exposing a deposited layer on at least one side to oxygen, or by spraying an oxygen-containing gas onto the deposited layer on at least one side during the winding of the metallized film into the product roll.

12 Claims, 7 Drawing Sheets

U.S. PATENT DOCUMENTS

| | | | |
|---|---|---|---|
| 3,936,545 A * | 2/1976 | Brill et al. | 427/343 |
| 4,282,268 A * | 8/1981 | Priestley et al. | 427/579 |
| 4,756,064 A * | 7/1988 | Yoshii et al. | 29/25.42 |
| 4,832,983 A * | 5/1989 | Nagatomi et al. | 427/81 |
| 5,522,955 A * | 6/1996 | Brodd | 156/182 |
| 5,610,796 A * | 3/1997 | Lavene | 361/303 |
| 5,905,628 A * | 5/1999 | Okuno et al. | 361/303 |
| 6,231,727 B1 * | 5/2001 | Vanden Brande et al. | 204/192.32 |
| 6,954,349 B2 * | 10/2005 | Shiota et al. | 361/303 |
| 2004/0207970 A1 * | 10/2004 | Shiota et al. | 361/271 |

FOREIGN PATENT DOCUMENTS

| | | |
|---|---|---|
| JP | 7-62238 | 7/1995 |
| JP | 2001-52949 | 2/2001 |

* cited by examiner

METHOD OF MANUFACTURING BOTH-SIDE METALLIZED FILM WITH REDUCED BLOCKING OF METALLIZED FILM AND METALLIZED FILM CAPACITOR USING THE SAME

FIELD OF THE INVENTION

The present invention relates to a both-side metallized film for use in a capacitor, and more particularly to a method of manufacturing a both-side metallized film and a capacitor using the same.

BACKGROUND OF THE INVENTION

A capacitor made of a metal layer-deposited plastic film (hereinafter referred to as a "metallized film capacitor") has conventionally found a wide range of applications. Particularly, a metallized film capacitor using a polypropylene (hereinafter referred to as PP) film has a wide range of applications, from a use for small electronic components represented by portable devices to a large-scale industrial use, e.g. drive motor control of a train and high-voltage phase advance. This is because a metallized film capacitor using a PP film has excellent electrical characteristics, e.g. small dielectric loss, high withstand voltage, and little change in a dielectric constant caused by changes in temperature and frequency.

FIG. 8 is a sectional view of a conventional metallized film capacitor using a PP film. The capacitor comprises two sheets of PP film 42 and metal-sprayed portions 34. The two sheets of PP film 42 have metal layer 41 deposited on one side thereof, and are overlaid and wound or laminated. The metal-sprayed portions are made by spraying metal from both end faces of the capacitor. As deposited metal layer 41, aluminum, zinc, and blends thereof have widely been used. Use of aluminum has a problem in that aluminum has a low adhesive strength with respect to metal-sprayed portions 34, and moreover, in application of voltages for an extended period of time, deterioration caused by oxidation of aluminum decreases capacitance. For this reason, zinc or a blend of zinc and aluminum has recently been used in many cases.

A widely employed structure of deposited metal layer 41 is a heavy edge structure shown in FIG. 8. A deposited metal layer in a capacitance-forming portion is thinner to improve a self-healing capability, and the deposited metal layer in a portion in contact with metal-sprayed portion 34 is thicker to enhance a bonding strength with metal-sprayed portion 34. The "self-healing capability" is a capability of the capacitor when local dielectric breakdown has occurred in a portion of a film, whereby evaporation and scatter of the deposited metal layer in the vicinity of the portion interrupts current.

With a conventional structure, two belts of PP film each having a deposited metal layer on one side thereof are used. Thus, each belt requires a vacuum deposition step and this necessitates a large number of man-hours.

If a metal layer can be deposited onto both sides of a PP film (hereinafter referred to as a "both-side metallized PP film") by one vacuum deposition step, and laminated over a non-metallized polypropylene film (hereinafter referred to as a "PP film for combination") to form a structure (see FIG. 7), the vacuum deposition step can be reduced to one half.

However, this method has a problem. When both sides of a film are metallized, the film needs to be wound once as product roll 3 in vacuum deposition machine 1 (see FIG. 1). At this time, deposited metal layers on both sides make contact with each other. The PP film has low wettability, and thus has low adhesive strength with respect to a deposited metal layer. In addition, the product roll is tightly wound (i.e. a winding stress accumulating inside of the product roll is strong). Thus, deposited metal layers on both sides adhere to each other (hereinafter referred to as "blocking") and are peeled by each other, when the film is drawn out of the product roll in subsequent steps, i.e. steps of slitting the metallized film and winding the film into a capacitor. As disclosed in U.S. Pat. No. 3,895,129, it is known that blocking more often occurs with a deposited metal layer of zinc than aluminum.

When a capacitor is produced by a both-side metallized PP film where blocking has developed, deposited metal layers on both sides are peeled by each other in the above-mentioned slitting and winding steps. This peeling deteriorates a function of capacitor electrodes and increases tan δ (dielectric loss tangent). Therefore, solving this blocking problem is essential to a both-side metallized PP film for a capacitor.

With regard to this point, a manufacturing method that decreases blocking has been proposed. For example, disclosed in the U.S. Pat. No. 3,895,129, as a manufacturing method of depositing zinc on both sides of a PP film, is a method of spraying air onto one of deposited surfaces to oxidize this deposited metal layer and then winding the film into a product roll.

Described in the Japanese Patent Application Non-examined Publication No. H07-62238, as a manufacturing method of depositing zinc, zinc alloys, or other metal layers on both sides of a synthetic resin film, is a manufacturing method of injecting oxidizing gases such as air and oxygen into a film winding room, that is in a vacuum chamber and separated from a vacuum deposition room by a partition. In other words, disclosed are the following steps: depositing a metal layer onto one side of a PP film; spraying an oxidizing gas onto a deposited surface to oxidize the deposited layer; depositing a metal layer onto an opposite side; spraying an oxidizing gas onto this deposited surface; and winding the film.

However, for the manufacturing methods disclosed in U.S. Pat. No. 3,895,129 and Japanese Patent Application Non-Examined Publication No. H07-62238, the blocking problem in a both-side metallized PP film using zinc or a blend of zinc and aluminum has not yet been solved.

In the manufacturing methods disclosed in U.S. Pat. No. 3,895,129 and Japanese Patent Application Non-Examined Publication No. H07-62238, air or oxidizing gas is sprayed onto a deposited surface of a PP film running at high speeds. Because running speeds of a PP film in a vacuum deposition process typically range from 300 m to 1,000 m per minute, the PP film is exposed to the air or oxidizing gas only for an extremely short period of time such as at most one hundredth of a second. Such a short exposure cannot form a sufficiently thick oxide layer on a deposited film of zinc or a blend of zinc and aluminum, and thus has not led to a solution of blocking. There are still the following problems.

Especially with a both-side metallized PP film for a capacitor, continuous deposition is generally performed on a long belt of PP film more than 10,000 m in length. For a product roll of such a long belt, winding stress from outside accumulates in inner winding portions (in the vicinity of a core) thereof. This causes blocking when the oxide film is insufficiently thick. When a capacitor is produced using such a both-side metallized PP film, tan δ of the capacitor increases as mentioned above.

Blocking is a phenomenon caused by adhesion of deposited layers on front and back surfaces of a PP film. Therefore, after the film has been stored for an extended period of time in a state of a product roll, an insufficiently thick oxide film again causes blocking and increases tan δ in a production of a capacitor. This is another problem.

In addition, when a metallized raw material roll is affected by moisture during long-term storage or transportation thereof, blocking may develop secondarily. Development of blocking caused by moisture occurs more frequently when a deposited metal layer is zinc or a blend of zinc and aluminum. This is because zinc is changed to oxide and hydroxide by moisture more easily.

Especially when a PP film is used as the film, deposited metal layers on front and back surfaces of the film adhered to each other by moisture easily peel off from the film. This is because the PP film has lower adhesive strength with a deposited metal layer than other film materials.

When a capacitor is produced using a both-side metallized film in which blocking has developed in this manner, wrinkles occurring during slitting and winding steps decrease a withstand voltage of the capacitor, or peeling of deposited layers, or oxidation or hydroxylation, of this deposited metal increases an electrode resistance to increase tan δ.

For this reason, when the both-side metallized film is stored or transported in a state of a raw material roll, the film must be kept at humidity lower than a one-side metallized film, or hermetically sealed in a package with a desiccant.

It is an object of the present invention to provide a method of manufacturing an excellent both-side metallized PP film having zinc, or a blend of zinc and aluminum, deposited onto both sides of a roll of a long PP film that is free from blocking even when the roll is stored for an extended period of time or affected by moisture. It is another object of the present invention to provide an excellent capacitor that requires a small number of man-hours and has no increase in tan δ caused by blocking.

SUMMARY OF THE INVENTION

A method of manufacturing both-side metallized insulation film of the present invention comprises steps of depositing zinc, or a blend of zinc and aluminum, onto both sides of an insulation film to make a both-side metallized insulation film, and winding the metallized film into a product roll. The method is characterized in spraying an oxidizing gas onto a deposited layer on an inner side of the insulation film to be wound during the winding thereof. Another aspect of a method of manufacturing of the present invention comprises steps of depositing zinc, or a blend of zinc and aluminum, onto both sides of an insulated film and winding this metallized film into a product roll. The method is characterized in forming an oil layer on at least one side of the metallized film, and exposing a deposited layer on at least one side of the metallized film to an oxygen-containing atmosphere, or spraying an oxygen-containing gas onto a deposited layer on at least one side of the metallized film, to form an oxide layer, during the winding of the metallized film into the product roll. Preferable material as the insulation film is a PP film.

DETAILED DESCRIPTION OF THE PREFERRED EMBODIMENTS

First Exemplary Embodiment

Figure 11:
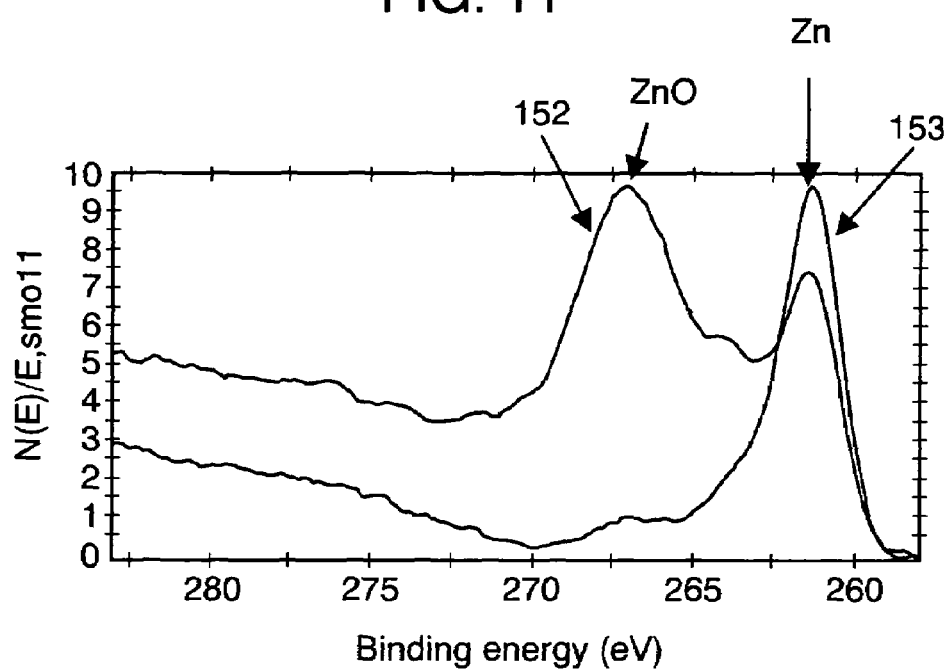
FIG. 11 is an analysis graph of an oxide layer of the metallized film capacitor in accordance with the second exemplary embodiment of the present invention.

As a first exemplary embodiment of the present invention, an example using a PP film as an insulation film is described with reference to FIGS. 1, 2 and 11.

Figure 1:
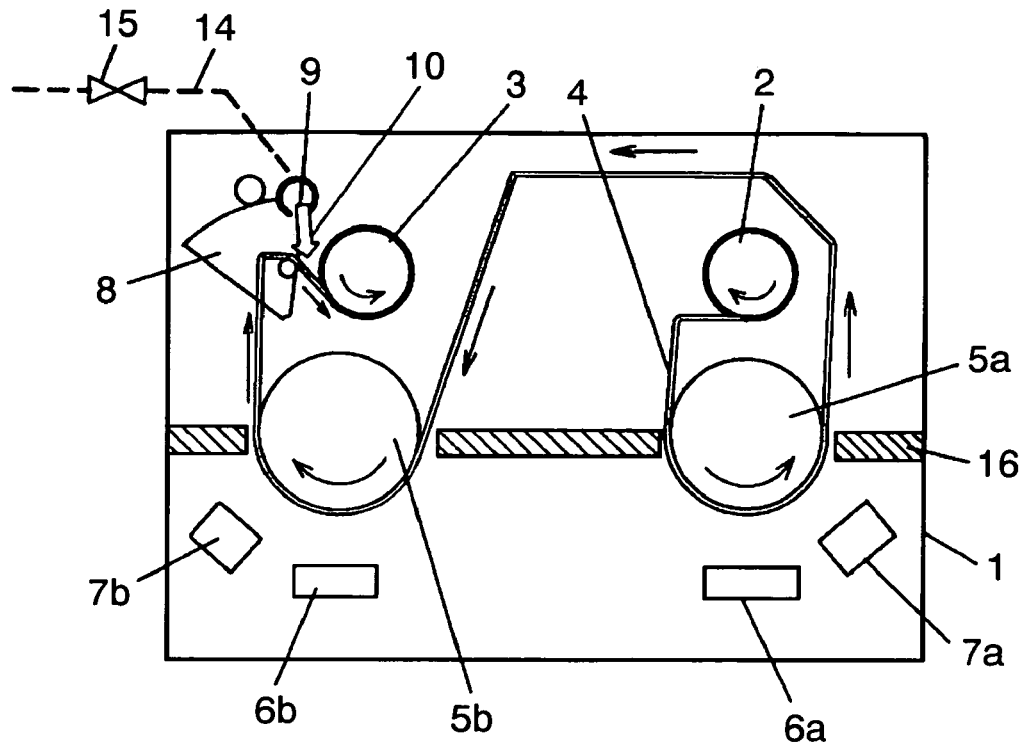
FIG. 1 is an explanatory view showing a method of manufacturing a both-side metallized PP film in accordance with a first exemplary embodiment of the present invention.

In FIG. 1, PP film 4 is drawn out from raw material roll 2 fitted in vacuum deposition machine 1. A metal layer on a primary side is deposited onto one side of PP film 4 on cooling can 5a from aluminum evaporation source 6a and zinc evaporation source 7a to form a primary side metal layer. Subsequently, a metal layer on a secondary side is deposited onto an opposite side of PP film 4 on cooling can 5b from aluminum evaporation source 6b and zinc evaporation source 7b to form a secondary side metal layer. Partition 16 is provided to partition a vacuum deposition chamber so that gas and moisture adsorbed in PP film 4 in raw material roll 2 do not deteriorate a degree of vacuum in the vicinity of evaporation sources 6a, 6b, 7a and 7b. Partition 16 has been provided conventionally.

Figure 2:
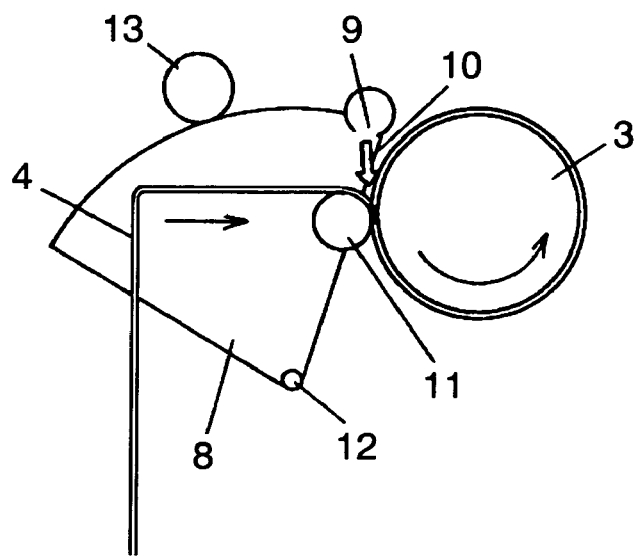
FIG. 2 is a partially enlarged view of a blow out section for spraying an oxidizing gas in accordance with the first exemplary embodiment of the present invention.

Then, PP film 4 having metal layer deposited on both sides is wound into product roll 3, via roller 11 provided in follow-up driver 8 (see FIG. 2). At this time, oxidizing gas 10 is sprayed onto an inner side of PP film 4 to be wound, from blow out nozzle 9 installed on follow-up driver 8. Follow-up driver 8 is a mechanism rotating around rotational shaft 12 that is driven by a pinion gear 13 to follow a radius of product roll 3 increasing during a vacuum deposition step and, as shown in the enlarged view of FIG. 2. Maintaining a constant distance between roll 11 provided on follow-up driver 8 and product roll 3 allows PP film 4 to be wound into product roll 3 uniformly, even in continuous deposition of a long belt of film.

A flow rate of oxidizing gas 10 is regulated by flow regulating valve 15, for example, and the oxidizing gas is sprayed through piping 14 from blow out nozzle 9. With a configuration of the present invention, oxidizing gas 10 sprayed is kept inside of product roll 3. As a result, deposited surfaces on both sides of PP film 4 are exposed to oxidizing gas 10 for an extended period of time and oxide layers are formed thereon in a stable manner. Thus, blocking of deposited surfaces on both sides can be prevented.

An installation position of blow out nozzle 9 is not specifically limited on condition that oxidizing gas 10 is sprayed onto the inner side of the film from this position. However, in continuous deposition of a long sheet of PP film 4 more than 10,000 m in length, for example, it is preferable to install the blow out nozzle on follow-up driver 8. In that position, even when a radius of product roll 3 increases during a vacuum deposition step, the nozzle can spray oxidizing gas 10 onto the film while maintaining a constant distance and angle with respect to the film. Therefore, a consistent blocking prevention effect can be provided throughout a long sheet of PP film 4.

Figure 7:
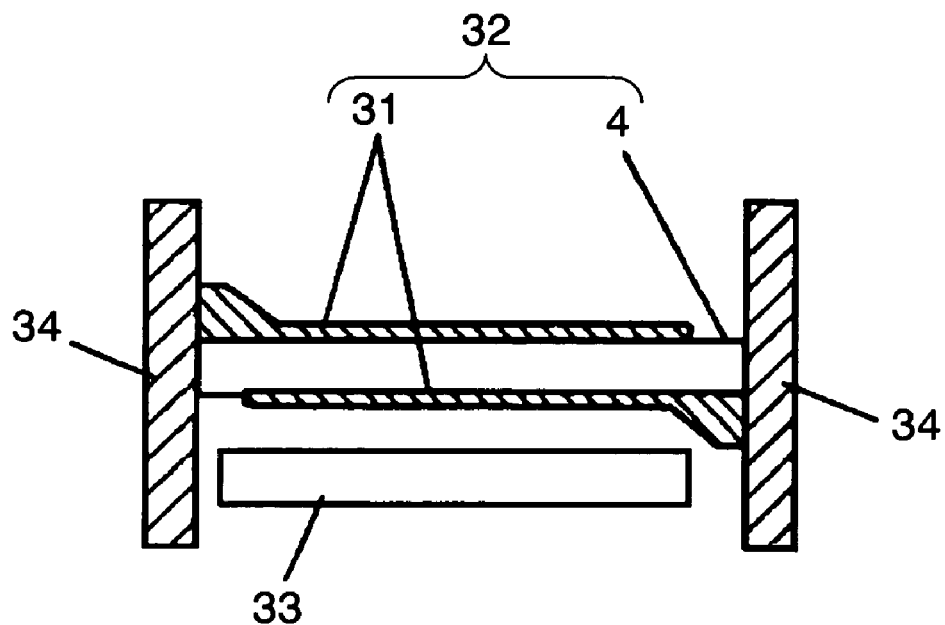
FIG. 7 is an explanatory view of a metallized film capacitor in accordance with the first exemplary embodiment of the present invention.
Figure 8:
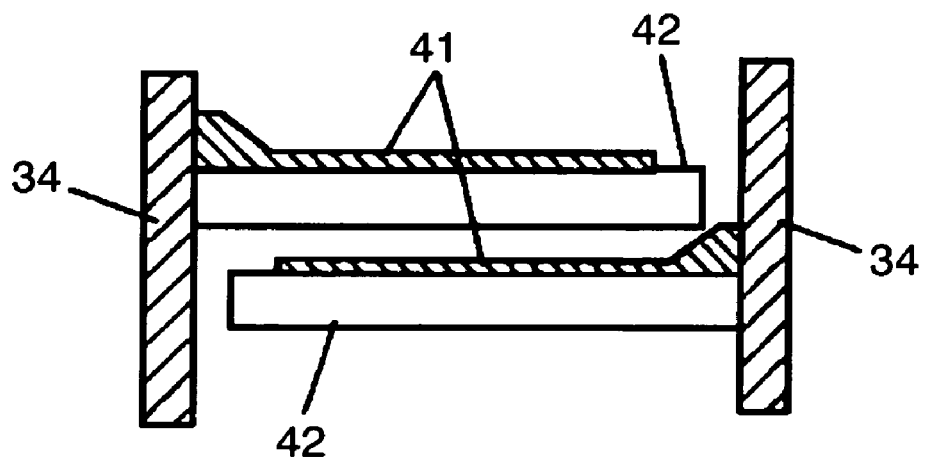
FIG. 8 is an explanatory view of a conventional metallized film capacitor.

FIG. 7 is a sectional view of a both-side metallized PP film capacitor. The PP film capacitor has both-side metallized PP film 32 and PP film for combination 33. Terminals 34 adhering to deposited electrodes 31 are formed by metal spraying.

Next, blocking of both-side metallized PP film 32 produced in accordance with the first exemplary embodiment is described in comparison with that of prior art.

As a both-side metallized PP film of this embodiment, the following kinds of both-side metallized PP films 32 were prepared using PP film 4 having a thickness of 4 μm and a length of 15,000 m.

Embodiment 1-1: PP film 4 was metallized with zinc on both sides thereof, sprayed with oxygen by the method shown in FIG. 1, and wound into product roll 3.

Embodiment 1-2: PP film 4 was metallized with a blend of zinc and aluminum on both sides thereof, sprayed with air by the method shown in FIG. 1, and wound into product roll 3.

Embodiment 1-3: PP film 4 was metallized with a blend of zinc and aluminum on both sides thereof, sprayed with oxygen by the method shown in FIG. 1, and wound into product roll 3.

Next, after each product roll 3 was taken out of the vacuum deposition machine, outermost and innermost parts of windings of each product roll 3 of the both-side metallized PP film 32 were sampled while film is drawn out. How deposited metal layer 31 has peeled off was observed with a 50× transmission microscope and pictures thereof were photographed. These pictures were digitized and converted into binary data by a personal computer. The binary data includes a portion in which deposited metal layer 31 has peeled off and a portion in which deposited metal layer 31 has not peeled off to provide a rate of how much deposited metal layer 31 has peeled off. For comparison, a rate of peeling was obtained with the following samples of both-side metallized PP films in accordance with prior art.

Prior Art 1-1: PP film 4 was metallized with zinc on both sides thereof and wound into product roll 3 without any treatment.

Prior Art 1-2: PP film 4 was metallized with a blend of zinc and aluminum on both sides thereof, sprayed with air by the method shown in FIG. 1 of the Japanese Patent Application Non-Examined Publication No. H07-62238, and wound into product roll 3.

Prior Art 1-3: PP film 4 was metallized with a blend of zinc and aluminum on both sides thereof, sprayed with oxygen by the method shown in FIG. 1 of the Japanese Patent Application Non-Examined Publication No. H07-62238, and wound into product roll 3.

A rate of peeling in a deposited metal layer of each sample is shown in Table 1. Table 1 shows that, in the present embodiment, the rate of peeling in the deposited metal layer is extremely low even in inner winding portions of product roll 3 where stress accumulates, and an excellent both-side metallized PP film which cannot be obtained with the prior art is produced.

TABLE 1

| | | | Peeling rate in deposited metal layer (%) | |
|---|---|---|---|---|
| | Oxidizing gas | Deposited metal | Outermost winding part of product roll | Innermost winding part of product roll |
| Embodiment 1-1 | Oxygen | Zinc | 0.3 | 0.8 |
| Embodiment 1-2 | Air | Zinc + Aluminum | 0.4 | 0.9 |
| Embodiment 1-3 | Oxygen | Zinc + Aluminum | 0.0 | 0.1 |
| Prior art 1-1 | none | Zinc | 6.2 | 38.6 |
| Prior art 1-2 | Air | Zinc + Aluminum | 2.2 | 8.3 |
| Prior art 1-3 | Oxygen | Zinc + Aluminum | 0.8 | 4.8 |

Figure 3:
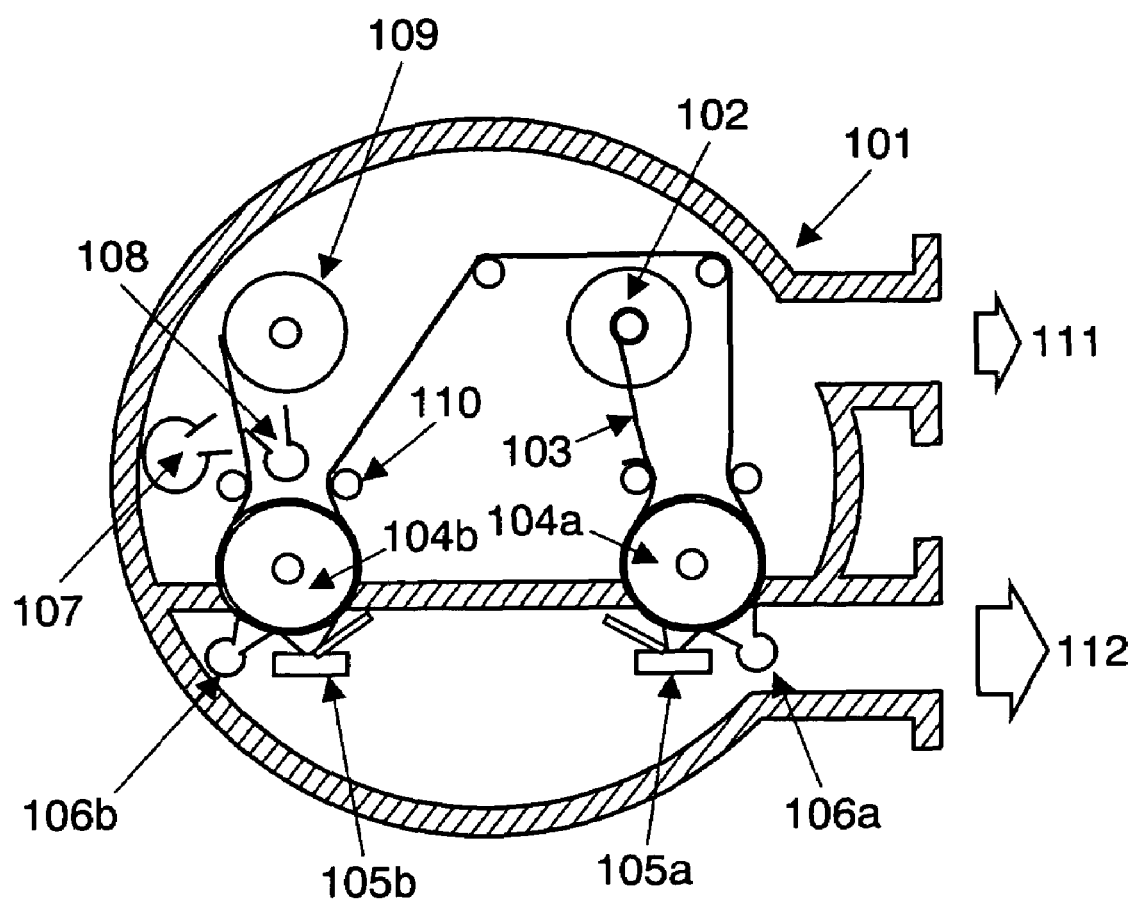
FIG. 3 is an explanatory view showing a method of manufacturing a both-side metallized PP film in accordance with a second exemplary embodiment of the present invention.

Next, as characteristic examples of a capacitor of the present embodiment, several kinds of both-side metallized PP films 32 produced in accordance with the first exemplary embodiment and PP film for combination 33 were wound to provide capacitors (10 μF) as shown in FIG. 3. Tan δ of each capacitor at a frequency of 1 kHz was measured.

For each capacitor, an innermost winding part of product roll 3 was used as both-side metallized PP film 32.

Obtained results are shown in Table 2. For each capacitor in accordance with the prior art, an equivalent serial resistance increases and thus tan δ increases. In contrast, each capacitor of the present embodiment has low tan δ and exhibits excellent characteristics.

TABLE 2

| | Tan δ |
|---|---|
| Embodiment 1-1 | 0.05 |
| Embodiment 1-2 | 0.05 |
| Embodiment 1-3 | 0.03 |
| Prior Art 1-1 | 0.48 |
| Prior Art 1-2 | 0.18 |
| Prior Art 1-3 | 0.15 |

For the first exemplary embodiment, PP film 4 having a thickness of 4 μm was used. Similar effects were obtained with a PP film having a different thickness.

An embodiment of the present invention is shown in FIGS. 1 and 2. However, the present embodiment is not limited by these drawings. Similar effects can be obtained on condition that a vacuum deposition step of depositing zinc or a blend of zinc and aluminum includes spraying of oxidizing gas 10 onto the inner side of PP film 4 when the film is wound into product roll 3. This vacuum deposition is performed onto both sides of PP film 4 drawn out from raw material roll 2, and the film is wound into product roll 3 in contact therewith.

In the present embodiment, oxygen and air are used as examples of oxidizing gas 10. The embodiment of the present invention is not limited by these gases. With ozone and other gases having an oxidizing property, or gases forming a passive state on a deposited metal surface, similar effects can be obtained.

In the above description, a PP film is described as an example of the insulation film. However, with an insulation film other than a PP film that is made of polyethylene terephthalate, polyethylene naphthalate, polyimide or other materials, the manufacturing method of the present invention can effectively be implemented.

Second Exemplary Embodiment

Next, a second exemplary embodiment of the present invention is described with reference to FIGS. 3 to 6 and FIGS. 9 to 11.

FIG. 3 is a sectional view of a production system of manufacturing a both-side metallized film in accordance with the second exemplary embodiment of the present invention.

While film 103 wound from draw out section 102 in vacuum chamber 101 passes over cooling cans 104a and 104b, aluminum evaporation sources 105a and 105b and zinc evaporation sources 106a and 106b metallize front and back sides of film 103. Next, oil layer formation section 107 maintains an amount of oil to jet during vacuum deposition constant and forms a uniform oil layer on deposited layer 121 even during a step of metallizing a long sheet of film.

Figure 5:
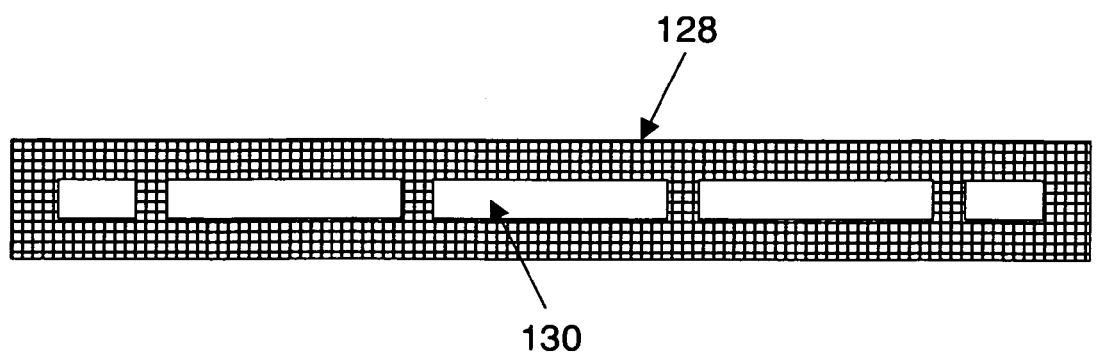
FIG. 5 is a partially enlarged view of a nozzle in the oil layer formation section in accordance with the second exemplary embodiment of the present invention.

FIG. 5 shows a shape of nozzle 128. Oil vapor jets from slits 130 provided in nozzle 128, thereby forming an oil layer on film 103 (not shown). Providing slits 130 intermittently as shown in this figure allows the oil layer to be formed only over a capacitance-formation portion of the metallized film (see 81 in FIG. 9).

Figure 6:
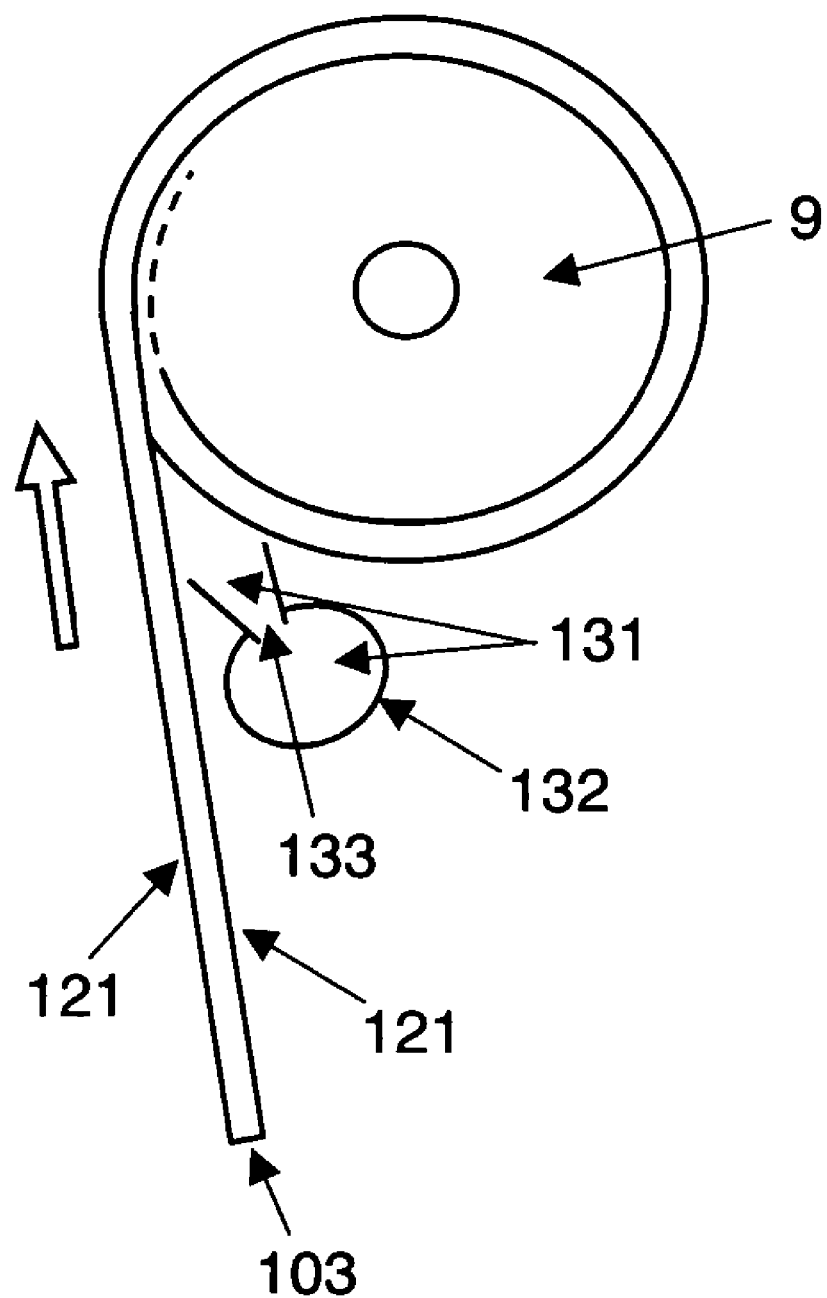
FIG. 6 is an enlarged sectional view of the vicinity of an oxygen exposing section shown in FIG. 3.

FIG. 6 is an enlarged sectional view of the vicinity of oxygen exposing section 108. Oxygen-containing gas 131 is introduced from outside of the vacuum chamber (not shown) into cylindrical pipe 132. The gas is sprayed from outlets 133 provided in pipe 132 onto deposited layer 121 on an inner side of film 103 to be wound. This operation allows exposure of deposited layers to oxygen for an extended period of time. Outlets 133 are provided in a direction of a total width of the film at regular intervals, which is not shown in FIG. 5.

Next described are evaluation results of blocking of the both-side metallized films of the second exemplary embodiment. Using a PP film 6 μm thick and 520 mm wide, several kinds of both-side metallized films as shown in Table 3 were prepared by a production system shown in FIG. 3. A length of each metallized film is 3,000 m. Vacuum deposition was performed so that each deposited layer has a resistance of 12Ω per unit area.

Each of so prepared both-side metallized films is kept in a state of a raw material roll for 20 days in an atmosphere at a temperature of 40° C. and a relative humidity of 60%. Thereafter, each film is cut by a slitter and observed as to whether it has wrinkles. A resistance of the deposited layer is also measured. The results are shown in Table 3.

TABLE 3

| | Deposited metal | Oil layer | Exposed atmosphere | Wrinkles in slitting | Resistance of deposited layer (Ω) |
| --- | --- | --- | --- | --- | --- |
| Embodiment 2-1 | Aluminum + Zinc | Silicone oil | Oxygen | None | 12 |
| Embodiment 2-2 | Aluminum + Zinc | Silicone oil | Air | None | 12 |
| Embodiment 2-3 | Aluminum + Zinc | Fluorocarbon oil | Oxygen | None | 12 |
| Embodiment 2-4 | Aluminum + Zinc | Paraffin oil | Oxygen | None | 15 |
| Embodiment 2-5 | Zinc | Silicone oil | Oxygen | None | 13 |
| Prior art 2-1 | Aluminum + Zinc | None | Oxygen | Observed | 23 |
| Prior art 2-2 | Zinc | None | Oxygen | Observed | 42 |
| comparative example | Aluminum + Zinc | Silicone oil | None | Observed | 28 | forms an oil layer. The film is exposed to oxygen by oxygen exposing section 108 and then wound by winding section 109 for production of a raw material roll of a both-side metallized film. In FIG. 3, reference numeral 110 shows an intermediate roll for passing the film, and reference numerals 111 and 112 show evacuation by a vacuum pump. Aluminum evaporation sources 105a and 105b and zinc evaporation sources 106a and 106b can deposit either aluminum or zinc only, or a blend of aluminum and zinc, depending on a purpose.

Figure 4:
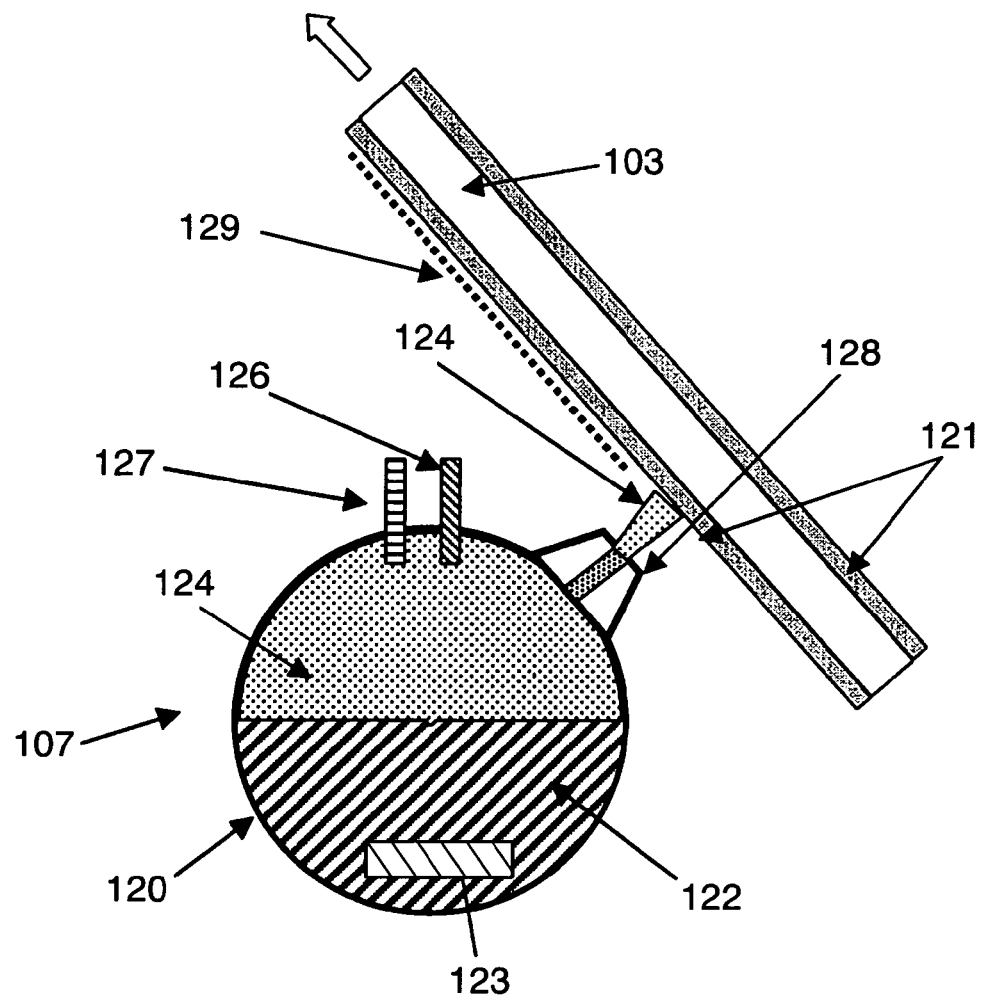
FIG. 4 is a partially enlarged view of an oil layer formation section in accordance with the second exemplary embodiment of the present invention.

FIG. 4 is an enlarged sectional view of the vicinity of oil layer formation section 107. Housed in a cylindrical oil tank 120 are oil 122, heater 123, temperature sensor 126, and pressure sensor 127. Oil 122 heated by heater 123 changes to oil vapor 124 and jets from nozzle 128, thereby forming oil layer 129 on deposited layer 121 on film 103 running in a direction of the arrow. Temperature sensor 126 and pressure sensor 127 monitor temperatures and pressures, respectively, inside of oil tank 120. Especially, pressure sensor 127

As obvious from Table 3, in the both-side metallized films of the prior art and comparative example, blocking causes wrinkles in slitting and the resistance of the deposited layers increases. In contrast, in the both-side metallized films of this embodiment, no wrinkles develop and increase in the resistance is inhibited. Especially when silicone oil or fluorocarbon oil is used for the oil layer, excellent results are obtained without an increase in the resistance.

Figure 9:
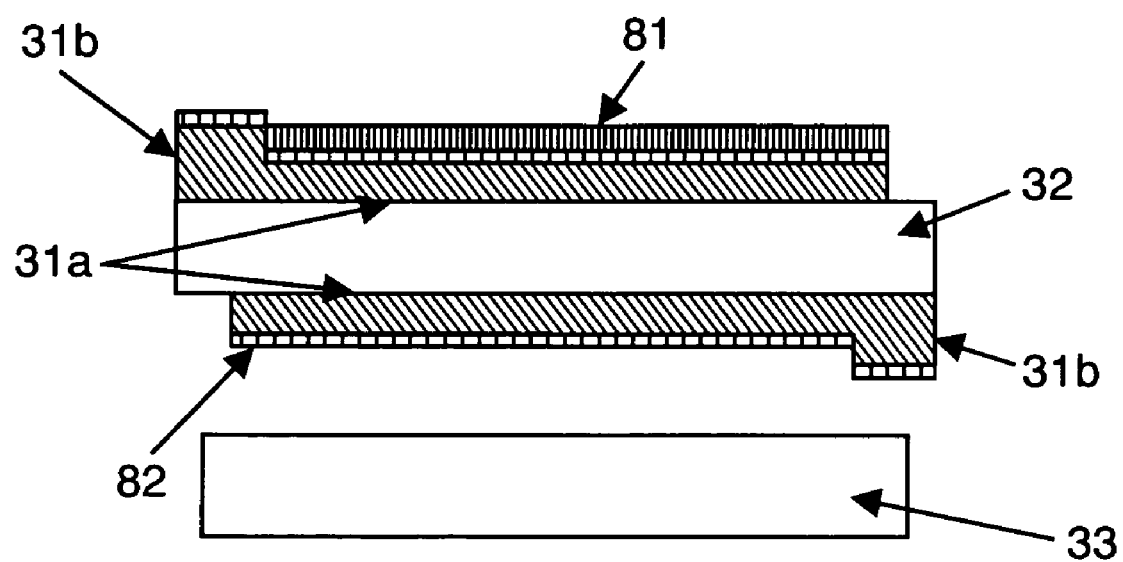
FIG. 9 is an explanatory view of a metallized film capacitor in accordance with the second exemplary embodiment of the present invention.

Next, metallized film capacitors as shown in FIG. 9 were produced, using the both-side metallized films of Embodiment 2-1 and Prior Art 2-1. With reference to FIG. 9, both-side metallized film 32 having deposited metal layers 31a and 31b on both sides, and film for combination 33, were wound. On both-side metallized film 32, oil layer 81 and oxide layer 82 were formed in accordance with the present embodiment.

In each metallized film capacitor produced in this manner, tan δ at a frequency of 1 kHz and a withstand voltage at a frequency of 60. Hz are measured. In a withstand voltage test, the withstand voltage was determined as a voltage at which each capacitor short-circuited when voltages applied thereto were increased by 50 V per minute at an ambient temperature of 70° C. Results are shown in Table 4.

For the capacitor of Prior Art 2-1, blocking increases tan δ, and wrinkles in slitting decreases the withstand voltage. On the other hand, the capacitor of the present embodiment exhibits an excellent tan δ and an excellent withstand voltage.

TABLE 4

|  | Tan δ (%) | Withstand voltage (Volts AC) |
| --- | --- | --- |
| Embodiment 2-1 | 0.05 | 1350 |
| Prior Art 2-1 | 0.18 | 1050 |

Figure 10:
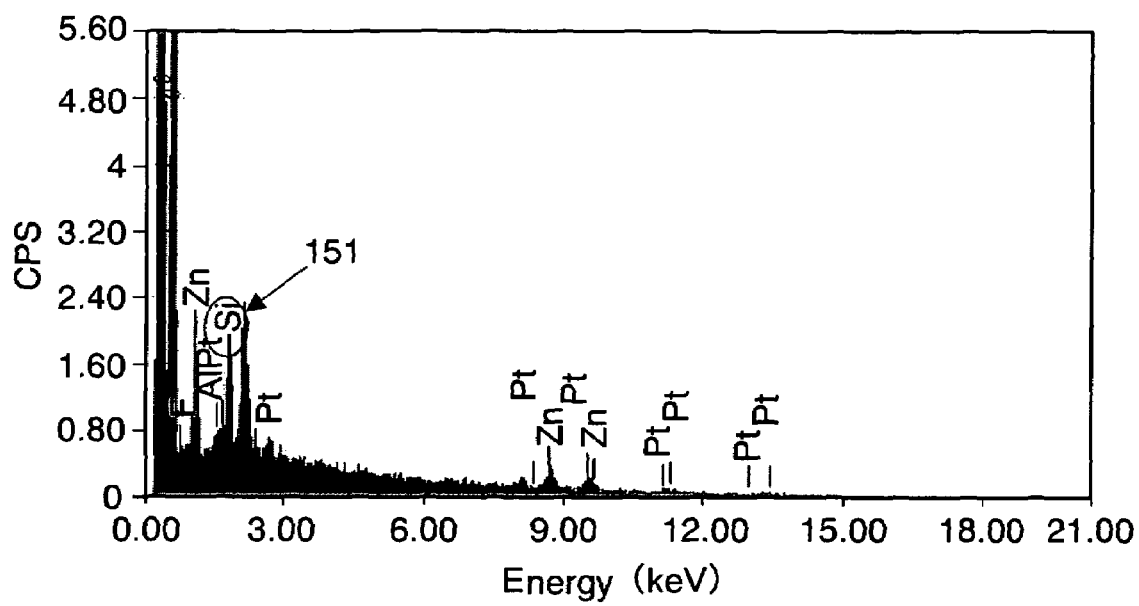
FIG. 10 is an analysis graph of an oil layer of the metallized film capacitor in accordance with the second exemplary embodiment of the present invention.

Now, existence of an oil layer of the present invention can be determined by the following steps. The both-side metallized film of each capacitor is sampled. This sampled film itself, or the deposited metal layer that has been extracted from the film using an appropriate solvent and condensed, is observed, using an energy dispersive X-ray analyzer included in an electron microscope, for example. An analysis result of the metallized film capacitor of the first embodiment is shown in FIG. 10, as an example. In the graph of FIG. 10, the abscissa axis shows an energy value of characteristic X-rays of elements constituting the both-side metallized film, and the ordinate axis shows a strength of each characteristic X-ray. A peak shown by circle 151 in the graph corresponds to silicon and existence of an oil layer made of silicone oil is recognized.

Existence of an oxide layer of the present invention can be determined by analyzing a surface of a deposited film by X-ray photoelectron spectroscopy (ESCA), for example. An analysis result of the metallized film capacitor of the first embodiment is shown in FIG. 11, as an example. In FIG. 11, the abscissa axis shows a bonding energy of zinc constituting deposited metal. A peak is detected at approximately 262 eV for metal zinc, and at approximately 267 eV for zinc oxide. In FIG. 11, curve 152 shows an analysis result of the surface of the deposited layer, and curve 153 shows an analysis result of an inside of the deposited layer after the surface thereof is removed by etching. Curve 152 showing the surface of the deposited layer has a large peak of zinc oxide and thus shows existence of an oxide layer.

In the second embodiment, the production system of FIGS. 3 to 6 is shown as an example. However, the production system of the present invention is not limited to this system. Similar effects can be obtained with a system for manufacturing a both-side metallized film, comprising: a vacuum deposition section for forming deposited metal layers on both sides of a film; an oil layer formation section for forming an oil layer on at least one side of the deposited layers formed by the vacuum deposition section; and an oxygen exposing section for exposing at least one side of the deposited layers formed by the vacuum deposition section to an oxygen-containing atmosphere.

For example, in FIG. 3, the system is configured so that the film passes by the oxygen exposing section after the oil layer formation section. However, similar effects can be obtained with a reverse configuration. In addition, a side on which the oil layer is formed can be a side exposed to oxygen, or a side opposite thereto. This is because, when the both-side metallized film is wound by winding section 109 of FIG. 3, the deposited surfaces on the front and back of the film are in contact with each other via the oil layer, and thus influence of moisture on both deposited surfaces can be prohibited. Of course, both sides can be coated with oil layers.

With reference to FIG. 4, oil vapor jets from slits, as an oil layer formation section. Instead of the slits, holes can be provided at regular intervals to jet oil vapor.

With reference to FIG. 3, oxygen or air is sprayed, in an oxygen exposing section. Similar effects can be obtained by exposing the film to an oxygen-containing atmosphere by other methods. For example, a housing containing an oxygen-containing gas is provided in a vacuum chamber and deposited layers 121 are exposed to oxygen by passing the film through the housing.

Shown in FIG. 9 as an example is a cross section of a metallized film capacitor of the present embodiment. However, the present invention is not limited to this example. Similar effects can be obtained even when deposited layers 31a and 31b do not have a heavy-edge structure and have a uniform thickness.

Third Exemplary Embodiment

In order to examine how states of the surface of PP film 4 exert influence on blocking, several kinds of PP films 4 having different wettability indices were prepared by changing strength of a corona treatment of PP films 4. The above-mentioned "wettability indices" are defined in JIS K-6768.

Subsequently, each PP film 4 was metallized with aluminum and zinc on both sides thereof and sprayed with oxygen by the method shown in FIG. 1 to produce both-side metallized PP film 32. For PP film 4 used, the thickness is 6 μm, the length is 2,000 m, surface roughness defined by JIS B-0601 measuring method are a maximum surface roughness Rmax of 1.3 μm and an average surface roughness Ra of 0.15 μm, and an isotactic index is 97%. A rate of peeling in the deposited layers and finishing of product roll 3 are examined. Obtained results are shown in Table 5.

TABLE 5

| Surface wettability index (dyn/cm) | | Peeling rate in deposited layers | |
| --- | --- | --- | --- |
| Primary side | Secondary side | Innermost winding part of product roll | Finishing of product roll |
| 34 | 34 | 0.0 | Excellent |
| 37 | 37 | 0.0 | Excellent |
| 41 | 41 | 0.0 | Excellent |
| 33 | 33 | 0.8 | Excellent |
| 42 | 42 | 0.0 | Wrinkles in film |
| 44 | 44 | Tear of film during deposition | Tear of film during deposition |

When the surface wettability index of PP film 4 is smaller than 34 dyn/cm, adhesive strength between deposited metal layer 31 and PP film 4 decreases and thus the rate of peeling in the deposited layers increases to 0.8%. When the surface wettability index exceeds 41 dyn/cm, both surfaces of PP film 4 adhere to each other in raw material roll 2 and this adhesion hinders a smooth drawing out operation. Therefore, wrinkles in product roll 3 and tearing of the film occur. The wettability indices of the PP film can be set by changing a strength of the corona discharge treatment or changing a time interval from the corona discharge treatment to vacuum deposition.

When the surface wettability indices of both sides of PP film 4 are in a range from 34 to 41 dyn/cm, both-side metallized PP film 32 free from blocking and causing excellent finishing of product roll 3 can be obtained. In the method of the second embodiment, similar results are obtained.

Next, in order to examine how the surface roughness of PP film 4 influences blocking, several kinds PP films 4 having different surface roughness are produced. Then, each PP film is metallized with aluminum and zinc on both sides and sprayed with oxygen by the method shown in FIG. 1 to produce several kinds of both-side metallized PP films 32. Moreover, each of these both-side metallized PP films 32 is cut using a slitter, and how wrinkles had developed during this slitting is examined. Results are shown in Table 6. Primary and secondary sides show each side of PP film 32.

TABLE 6

| Maximum surface roughness Rmax (μm) | | Average surface roughness Rmax (μm) | | Wrinkles in slitting |
|---|---|---|---|---|
| Primary side | Secondary side | Primary side | Secondary side | |
| 1.75 | 1.72 | 0.16 | 0.18 | None |
| 1.54 | 1.46 | 0.14 | 0.14 | None |
| 1.12 | 1.08 | 0.10 | 0.11 | None |
| 1.05 | 0.90 | 0.10 | 0.08 | Observed |
| 0.91 | 0.92 | 0.09 | 0.08 | Obserced |

When the maximum surface roughness Rmax of PP film 4 is at least 1 μm and the average surface roughness Ra thereof is at least 0.1 μm, no wrinkles develop in winding into a capacitor. In the method of the second embodiment, similar results are obtained.

The both-side metallized PP film has deposited metal layers on both sides. Therefore, when the surface roughness thereof is smaller than the above values, the both-side metallized PP film does not run smoothly, or runs in a zigzag line on a large number of rollers provided in a slitter (not shown) for cutting the both-side metallized PP film into a predetermined width and a winder (not shown), or causes wrinkles. When Rmax exceeds 2.0 μm, the thickness of the PP film becomes not uniform. Thus, when a capacitor is made of such a film and voltages are applied thereto, a thinnest portion of the PP film is likely to breakdown. Consequently, it is preferable that Rmax is smaller than 2.0 μm.

Moreover, in order to examine how stereoregularity of PP film 4 influences blocking, several kinds of PP films 4 having different isotactic indices were prepared. Each PP film 4 was metallized with aluminum and zinc on both sides thereof and then exposed to oxygen gas by the method shown in FIG. 1 to produce several kinds of product rolls 3 of both-side metallized PP films 32. Each product roll 3 was kept in an atmosphere of 40° C. for 60 days and degrees of the blocking were examined. Results are shown in Table 5.

TABLE 7

| | Peeling rate of deposited metal layer (%) | |
|---|---|---|
| Isotactic index (%) | 7 days after deposition | 60 days after deposition |
| 96 | 0.0 | 0.0 |
| 97 | 0.0 | 0.0 |
| 95 | 0.0 | 0.3 |

For PP film 4 having an isotactic index of 95%, blocking is observed. While the roll is left at a temperature of 40° C. for 60 days, thermal shrinkage of both-side metallized film 32 proceeds and product roll 3 is gradually wound tighter, thereby causing deposited metal layers 31 to adhere and to be peeled by each other. When the isotactic index was at least 96%, no blocking is observed. This is because high stereoregularity of PP film 4 prevents thermal shrinkage. For this reason, when the isotactic index is at least 96%, both-side metallized PP film 32 that can be stored for an extended period of time in a state of product roll 3 without blocking can be produced. In the method of the second embodiment, similar results are obtained.

INDUSTRIAL APPLICABILITY

As described above, in a method of manufacturing a both-side metallized film of the present invention, oxidizing gas is wound inside of a product roll. This allows oxidation reaction of deposited layers to proceed even after a metallized insulation film is wound into the product roll, and thus allows formation of sufficiently thick oxide layers on the deposited layers. Therefore, a both-side metallized film free from blocking can be produced even when continuous deposition is performed on a long sheet of an insulation film.

In a manufacturing method of the present invention, an oil layer is formed on at least one side of the film. This allows production of an excellent both-side metallized film free from development of blocking caused by moisture even when the film is stored for an extended period of time and transported in a state of a product roll.

In a manufacturing method of the present invention, an oxidizing gas is wound inside of a product roll and an oil layer is formed on at least one side of a film. This allows production of an excellent both-side metallized film free from blocking and development of blocking caused by moisture even when continuous vacuum deposition is performed on a long sheet of insulation film.

In a manufacturing method of the present invention, a blow out nozzle for spraying an oxidizing gas moves according to a radius of a product roll that increases during a vacuum deposition step. Thus, the blow out nozzle can spray oxidizing gas from a position at a constant distance from the film, from startup of vacuum deposition when the radius of the product roll is small to completion of the vacuum deposition when the radius has increased. As a result, a homogeneous both-side metallized film can be manufactured even during a continuous deposition step of a long sheet of film.

In a manufacturing method of the present invention, use of oxygen as the oxidizing gas can minimize deterioration of a degree of vacuum caused by the oxidizing gas.

In a manufacturing method of the present invention, chemically stable silicone oil and fluorocarbon oil are used as the oil for forming the oil layer. This allows production of an excellent both-side metallized film free from peeling of the deposited layers caused by penetration of oil into the insulation film and swelling thereof to increase resistance of a metal layer.

In a method of manufacturing a both-side metallized film of the present invention, an oil layer is formed only in predetermined portions along a width of the film. This allows production of a both-side metallized film in good contact with metal-sprayed portions.

In a method of manufacturing a both-side metallized film of the present invention, spraying oil vapor in a non-contact manner allows production of a both-side metallized film without damaging a deposited layer.

In a method of manufacturing a both-side metallized film of the present invention, a pressure sensor is provided in an oil tank and oil vapor is sprayed onto a deposited layer while oil vapor pressures are monitored. Therefore, an oil layer can be formed on a long sheet of film at a constant rate.

In a method of manufacturing a both-side metallized PP film of the present invention, surface wettability indices of both sides of the PP film range from 32 to 41 dyn/cm. This setting allows for production of an excellent both-side metallized PP film that has excellent adhesive strength between a deposited metal layer and the PP film, and is free from adhesion of surfaces of the PP film in a raw material roll.

In a method of manufacturing a both-side metallized PP film of the present invention, a surface roughness of at least one side of the PP film is set to have Rmax of 1.0 to 2.0 μm and Ra of not less than 0.1 μm. This setting allows production of a both-side metallized PP film that does not have wrinkles or does not run in a zigzag line during subsequent slitting and winding steps, and has excellent workability.

In a method of manufacturing a both-side metallized PP film of the present invention, a PP film having an isotactic index of at least 96% is used. Improved stereoregularity of crystals in the PP film can improve a modulus of elasticity of the PP film and decreases winding stress of a product roll. This allows production of a both-side metallized PP film exhibiting excellent long-term storage and transportation stability when the film is stored for an extended period of time and transported in a state of a product roll.

In addition, a metallized film capacitor of the present invention provides an inexpensive capacitor requiring only one vacuum deposition step and exhibiting excellent electrical characteristics.

| Reference numerals | |
|---|---|
| 1 | Vacuum deposition machine |
| 2 | Raw material roll |
| 3 | Product roll |
| 4 | PP film |
| 5a, 5b | Cooling can |
| 6a, 6b | Aluminum evaporation source |
| 7a, 7b | Zinc evaporation source |
| 8 | Follow-up driver |
| 9 | Blow out nozzle |
| 10 | Oxidizing gas |
| 11 | Roller |
| 12 | Rotation shaft |
| 13 | Pinion gear |
| 14 | Piping |
| 15 | Flow regulating valve |
| 16 | Partition |
| 30 | Slit |
| 31 | Deposited metal layer |
| 31a, 31b | Deposited metal layer |
| 32 | Both-side metallized film |
| 33 | PP film for combination |
| 34 | Metal-sprayed portion |
| 41 | Metal layer |
| 42 | PP film |
| 81 | Oil layer |
| 82 | Oxide layer |
| 101 | Vacuum chamber |
| 102 | Drawing out section |
| 103 | PP film |
| 104a, 104b | Cooling can |
| 105a, 105b | Aluminum evaporation source |
| 106a, 106b | Zinc evaporation source |
| 107 | Oil layer formation section |
| 108 | Oxygen exposing section |
| 109 | Winding section |
| 110 | Intermediate roll |
| 111, 112 | Evacuation by vacuum pump |
| 120 | Oil tank |

-continued

| Reference numerals | |
|---|---|
| 121 | Deposited layer |
| 122 | Oil |
| 123 | Heater |
| 126 | Temperature sensor |
| 127 | Pressure sensor |
| 128 | Nozzle |
| 129 | Oil layer |
| 130 | Slit |
| 131 | Gas |
| 123 | Cylindrical pipe |
| 133 | Outlet |
| 151 | Peak |
| 152, 153 | Curve |

The invention claimed is:

1. A method of manufacturing double metallized film, comprising:
vacuum depositing zinc or a zinc-aluminum mixture onto opposite facing surfaces of an insulating film so as to provide a vacuum deposited film having opposite facing surfaces;
winding said vacuum deposited film into a product roll, while spraying oxidizing gas onto one of said opposite facing surfaces of said vacuum deposited film so as to oxidize said one of said opposite facing surfaces and thereby form an oxide layer; and
forming an oil layer on one of said opposite facing surfaces of said vacuum deposited film,
wherein forming an oil layer on one of said opposite facing surfaces of said vacuum deposited film includes one of
(i) forming said oil layer on said oxide layer, and
(ii) forming said oil layer on the surface of said vacuum deposited film other than the surface having said oxide layer.

2. The method according to claim 1, wherein
forming an oil layer on one of said opposite facing surfaces of said vacuum deposited film comprises forming an oil layer from one of silicone oil and fluoro-carbon oil.

3. The method according to claim 2, wherein
forming an oil layer from one of silicone oil and fluoro-carbon oil comprises spraying oil vapor of said one of silicone oil and fluoro-carbon oil.

4. The method according to claim 3, wherein
forming said oil layer on said one of said opposite facing surfaces of said vacuum deposited film comprises forming said oil layer only on a predetermined portion of said one of said opposite facing surfaces in a widthwise direction of said vacuum deposited film.

5. The method according to claim 3, wherein
spraying oil vapor of said one of silicone oil and fluoro-carbon oil comprises spraying said oil vapor while monitoring oil vapor pressure by using a pressure sensor disposed in an oil tank.

6. The method according to claim 1, wherein
vacuum depositing zinc or a zinc-aluminum mixture onto opposite facing surfaces of an insulating film comprises vacuum depositing zinc or a zinc-aluminum mixture onto opposite facing surfaces of a polypropylene film.

7. The method according to claim 6, wherein
vacuum depositing zinc or a zinc-aluminum mixture onto opposite facing surfaces of a polypropylene film comprises vacuum depositing zinc or a zinc-aluminum mixture onto opposite facing surfaces of a polypropylene film of which a surface wetting index of each of said opposite facing surfaces is 34-41 dyn/cm, with said surface wetting index being defined in JIS K-6768.

8. The method according to claim 6, wherein vacuum depositing zinc or a zinc-aluminum mixture onto opposite facing surfaces of a polypropylene film comprises vacuum depositing zinc or a zinc-aluminum mixture onto opposite facing surfaces of a polypropylene film of which a roughness Rmax of at least one of said opposite facing surfaces is 1.0-2.0 µm and a roughness Ra of said at least one of said opposite facing surfaces is at least 0.1 µm, with Rmax being a maximum surface roughness and Ra being an average surface roughness, and with each of Rmax and Ra being defined by a method specified in JIS B-0601.

9. The method according to claim 6, wherein vacuum depositing zinc or a zinc-aluminum mixture onto opposite facing surfaces of a polypropylene film comprises vacuum depositing zinc or a zinc-aluminum mixture onto opposite facing surfaces of a polypropylene film having an isotacticity of at least 96%.

10. The method according to claim 1, wherein spraying oxidizing gas onto one of said opposite facing surfaces of said vacuum deposited film comprises spraying said oxidizing gas onto a surface of said vacuum deposited film that is to be an inner side surface when said vacuum deposited film is wound into said product roll.

11. The method according to claim 1, wherein spraying oxidizing gas onto one of said opposite facing surfaces of said vacuum deposited film comprises spaying said oxidizing gas through a blowout port while moving said blowout port in accordance with an increasing radius of said product roll.

12. The method according to claim 1, wherein spraying oxidizing gas onto one of opposite facing surfaces of said vacuum deposited film comprises spraying one of oxygen and air.

* * * * *